(12) United States Patent
White et al.

(10) Patent No.: US 7,531,464 B2
(45) Date of Patent: May 12, 2009

(54) SEMICONDUCTIVE DEVICE FABRICATED USING A SUBSTANTIALLY DISASSOCIATED CHLOROHYDROCARBON

(75) Inventors: Jeff White, Terrell, TX (US); Jon Holt, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 208 days.

(21) Appl. No.: 11/313,202

(22) Filed: Dec. 20, 2005

(65) Prior Publication Data
US 2007/0141853 A1    Jun. 21, 2007

(51) Int. Cl.
*H01L 21/302* (2006.01)
(52) U.S. Cl. .................. 438/774; 257/E21.284
(58) Field of Classification Search .................. 438/769, 438/774, 425–426
See application file for complete search history.

(56) References Cited

U.S. PATENT DOCUMENTS

| | | | |
|---|---|---|---|
| 4,169,862 A | 10/1979 | Eden | |
| 5,288,662 A | 2/1994 | Lagendijk et al. | |
| 5,599,425 A * | 2/1997 | Lagendijk et al. | 438/743 |
| 6,096,623 A * | 8/2000 | Lee | 438/425 |
| 6,140,251 A * | 10/2000 | Arghavani et al. | 438/778 |
| 6,221,789 B1 | 4/2001 | Arghavani et al. | |
| 6,303,522 B1 * | 10/2001 | Mertens et al. | 438/774 |
| 6,335,295 B1 * | 1/2002 | Patel | 438/773 |
| 6,884,295 B2 | 4/2005 | Ishii et al. | |
| 2002/0017671 A1 * | 2/2002 | Goebel et al. | 257/301 |
| 2004/0214404 A1 * | 10/2004 | Kubota et al. | 438/435 |
| 2005/0129928 A1 | 6/2005 | Lee et al. | |

* cited by examiner

*Primary Examiner*—Alexander G Ghyka
*Assistant Examiner*—Reema Patel
(74) *Attorney, Agent, or Firm*—Wade J. Brady, III; Frederick J. Telecky, Jr

(57) ABSTRACT

The invention provides a method of fabricating a semiconductive device. In one aspect, the method comprises heating a gas mixture [225] comprising chlorohydrocarbon having a general formula of $C_xH_xCl_x$, wherein x=2, 3, or 4. The chlorohydrocarbon is heated in a first chamber 210 to a first temperature that substantially disassociates the chlorohydrocarbon. The substantially disassociated chlorohydrocarbon is used to form a film on a semiconductive substrate [235] that is located in a second chamber [215].

14 Claims, 5 Drawing Sheets

US 7,531,464 B2

SEMICONDUCTIVE DEVICE FABRICATED USING A SUBSTANTIALLY DISASSOCIATED CHLOROHYDROCARBON

TECHNICAL FIELD OF THE INVENTION

The invention is directed in general to a semiconductive device, and more specifically, to a semiconductive device fabricated by using a chlorinated hydrocarbon that has been substantially disassociated in a disassociation furnace.

BACKGROUND

With each node generation, the ongoing miniaturization and component densification of semiconductive devices presents new challenges to the semiconductor manufacturing industry. One challenge occurs where chlorohydrocarbon, such as trans 1,2-dichloroethylene, is used to form oxide films over a semiconductive substrate. The chlorine disassociated from a chlorohydrocarbon is often used to form an oxide liner within an isolation trench. The chlorine promotes corner rounding at the upper edges of the trench and also functions as a getter for contaminants during the oxide liner's formation. The corner rounding is beneficial because it helps prevent structural thinning at the upper corners of trench, which reduces the risk of structural breakdown when subjected to operating voltages.

Typically, the chlorohydrocarbon along with a carrier nitrogen gas is first introduced into a heating chamber that is operated at temperatures of around 900° C. before it is passed into the deposition chamber. Problems arise however, because substantial disassociation is not presently achieved in the heating chamber. This requires the deposition chamber to be operated at temperatures at least as high as the heating chamber (e.g. 900° C.) to achieve the complete disassociation of the chlorine from the hydrocarbon. Further problems are encountered due to the fact that the high operating temperature within the deposition chamber makes oxidation growth difficult to control.

Because the process temperatures within both the heating and deposition chambers are equally high, the growth rate of the silicon oxide film is hard to control and thicknesses less than about 7.0 nm to about 8.0 nm are, therefore, very difficult to achieve. Lowering the operating temperature within the deposition chamber is not a viable option because the higher temperatures of 800° C. or more must be used in the deposition chamber to complete the disassociation of the chlorine from the hydrocarbon and prevent the incorporation of the carbon into the oxide film. Furthermore, increasing the dimensions of the trenches so that the thickness of the oxide liner does not close off the trench or produce a trench that is too narrow to receive high density plasma or other material is also not a viable option since critical dimensions of all semiconductive components, including trench size, is continually shrinking.

Accordingly, what is needed in the art is a semiconductive device and method of manufacturing that device that provides for the continued use of these chlorohydrocarbons without the detriments associated with the above-discussed conventional processes.

SUMMARY OF INVENTION

To overcome the deficiencies in the prior art, the invention, in one embodiment, provides a method of fabricating a semiconductive device that comprises heating a gas mixture comprising chlorohydrocarbon having a general formula of $C_xH_x$-$Cl_x$, wherein $x=2$, 3, or 4. The chlorohydrocarbon is heated in a first chamber to a first temperature that substantially disassociates the chlorohydrocarbon. The substantially disassociated chlorohydrocarbon is used to form a film on a semiconductive substrate that is located in a second chamber.

In another embodiment, the semiconductive device is an integrated circuit (IC). The semiconductive device comprises a semiconductive substrate and an isolation trench located within the semiconductive substrate. The isolation trench includes an oxide liner located therein having an average thickness within the isolation trench of less than about 8 nm. The isolation trench is at least substantially filled with a dielectric material.

BRIEF DESCRIPTION OF THE DRAWINGS

The invention is best understood from the following detailed description when read with the accompanying FIGURES. Reference is now made to the following descriptions taken in conjunction with the accompanying drawings, in which.

DETAILED DESCRIPTION

Figure 1:
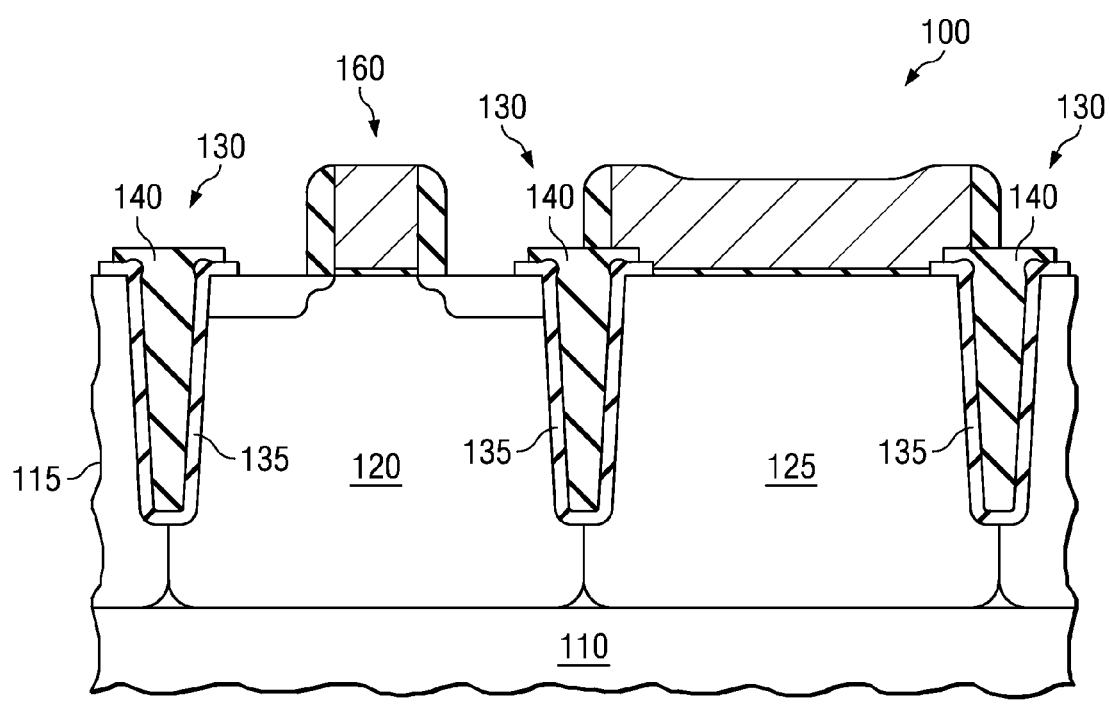
FIG. 1 illustrates a sectional view of one embodiment of a semiconductive device provided by the invention.

FIG. 1 is one embodiment of a semiconductive device 100 of the invention. The semiconductive device 100 comprises a conventional semiconductive substrate 110, such as silicon, silicon-germanium, or gallium arsenide. Located over the substrate 110 is a conventional active region 115. The active region 115 may be a portion of the substrate 110 that is doped to function as an active region, or it may be a conventional doped epitaxial layer. Conventional wells 120 and 125 are located in the active region 115. The wells may be doped with the same type of dopant, or they may be complementary doped wells. Isolation structures 130, such as shallow trenches, are also located in the active region 115. The isolation structures 130 include an oxide liner 135 and are filled with a conventional dielectric material 140, such as a high density plasma oxide. The method of manufacturing the semiconductive device 100 is discussed below.

Figure 2:
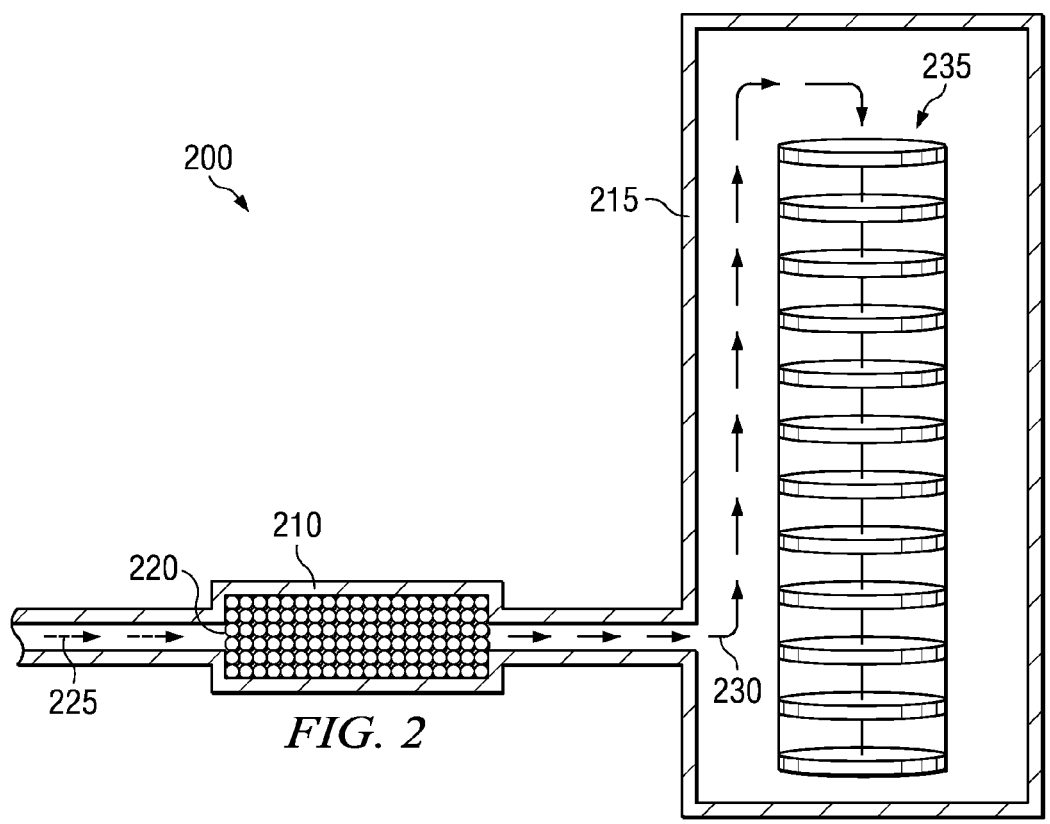
FIG. 2 illustrates a schematic view of a deposition system used to make the semiconductive device.

FIG. 2 is a schematic view of a deposition system 200 that can be used to fabricate the semiconductive device 100 of FIG. 1. In one embodiment, the deposition system 200 comprises a first chamber 210 and a second chamber 215. In the illustrated embodiment, the first chamber 210 is a commercially available disassociation or pre-activation chamber that has an internal increased surface area 220. The commercial version of the illustrated embodiment can be obtained from Tokyo Electron Limited, Akasaka, Japan.

The surface area 220 has an increased internal surface area. As used herein, an increased internal surface area means that the internal surface area of the first chamber 210 is increased over the original surface area (i.e. the surface area defined by substantially smooth walls that have not been purposefully roughened or altered). The surface area 220 may be increased in a number of ways. For example, the surface area 220 may be increased by packing the first chamber 210 with quartz beads, as shown in FIG. 2. In another embodiment, the surface area 220 may be increased by dimpling or otherwise roughening the internal walls of the first chamber 210, or it may be increased by placing plates within the first chamber 210, or a combination of these embodiments might be employed to increase the surface area. The surface area of the plates themselves may also be increased by attaching quartz beads to the surfaces, or otherwise roughening the surfaces of the plates. In one example, the increased internal surface area 220 may be increased by 10 times to 140 times over the original surface area.

A gas mixture 225 (indicated by the arrow) is carried from a supply source, not shown, into the first chamber 210. The gas mixture 225 comprises oxygen and chlorohydrocarbon that is carried by nitrogen from a supply source (not shown). The chlorohydrocarbon has the general formula $C_xH_xCl_x$, where x is 2, 3, or 4. Species of the $C_xH_xCl_x$ chloro-hydrocarbon include trans-dichloroethylene, cis-dichloro-ethylene, 1,1-dichloro-ethylene, and mixtures thereof. In one example, the chlorohydrocarbon is trans-1,2-dichloroethylene ($C_2H_2Cl_2$), which is commercially available as Trans LC™ from the Schumacher unit of Air Products and Chemicals, Inc., Carlsbad, Calif., USA.

Such chlorohydrocarbons have been found useful in the chloroxidation of silicon because they breakdown efficiently at temperatures at least as low as 800° C. to give high quality silicon oxides with low carbon incorporation, and because they are less detrimental to the earth's ozone layer than previously used compounds, such as 1,1,1-trichloroethane (TCA). In addition to its application as a chlorine source for oxidation of silicon, trans 1,2-dichloroethylene can act as a getter for metal contamination, reducing oxide stacking faults and increasing minority carrier lifetime.

As discussed above, in conventional processes, it is difficult to control the growth of the oxide film because the deposition chamber temperature must be kept high enough to complete the disassociation of the chlorohydrocarbon, which results in an oxide liner having a greater thickness than desired. The presence of this thick film prevents the dielectric from completely filling the trench and voids are formed within the dielectric located in the trench.

The invention addresses these problems by using the first chamber 210. In contrast to conventional processes, the chlorohydrocarbon is substantially disassociated within the first chamber 210. For example, about 75% to about 100% of the chlorine is disassociated from the hydrocarbon chain, and in another example about 90% to about 100% of the chlorine is disassociated. The temperature at which the first chamber 210 is operated may be greater than about 800° C. or greater than about 900° C. For example, uniform deposition was achieved in the second chamber 215 by operating the first chamber 210 at a temperature of about 950° C. It is believed that the increased surface area of the first chamber 210 provides a greater heating surface area, which allows for greater disassociation of the chlorine from the hydrocarbon. Additionally, the flow rate of the gas mixture 225 through the first chamber 210 can also impact the amount of disassociation that occurs. In one embodiment, the gas mixture 225 is flowed through the first chamber 210 at a flow rate that ranges from about 4 liters per minute to about 11 liters per minute. In one embodiment, the chlorohydrocarbon comprises from about 0.75% to about 5.5% of the total volume flow through the first chamber 210 and oxygen nitrogen comprises the remainder of the total volume of the gas mixture 225. In another application, the flow rate of the gas mixture 225 is about 8.4 liters per minute with the chlorohydrocarbon comprising about 2.4% of the total volume of the gas mixture 225.

Upon substantial disassociation of the chlorohydrocarbon, a gas mixture 230 (indicated by the arrow), comprising the disassociated chlorine and hydrocarbon, and oxygen, is transmitted into the second chamber 215, which may contain one or more wafers 235 having a semiconductive surface. The gas mixture 230 is used to form a film, such as an oxide film, on the wafer 235. Since the chlorohydrocarbon is substantially disassociated in the first chamber 210, the deposition temperature in the second chamber 215 can be kept lower than the temperature in the first chamber 210. For example, the deposition temperature in the second chamber 215 may be less than about 800° C., or in another embodiment, it may be less than about 700° C. Thus, the growth of the film can be better controlled and a film thickness of about 8 nm or less can be achieved.

Figure 3:
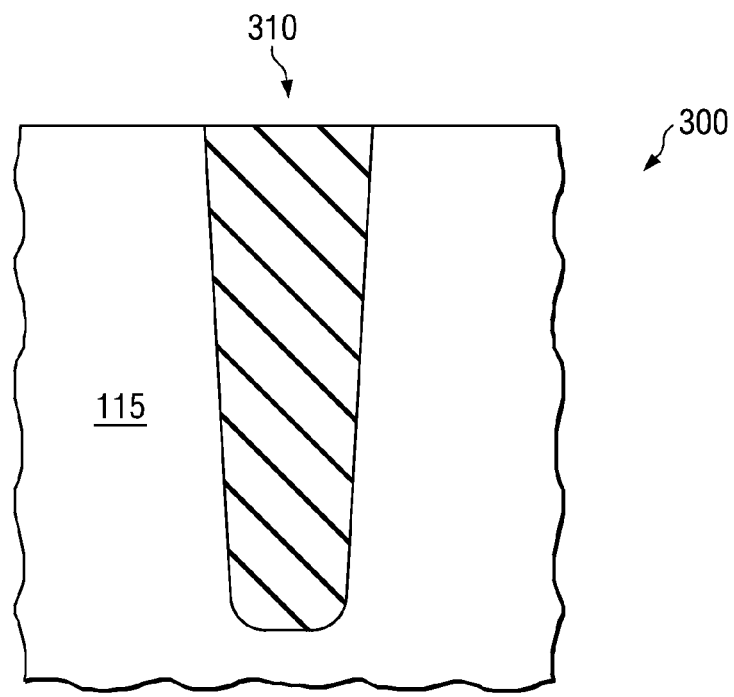
FIG. 3 illustrates a sectional view of a trench implemented in the semiconductive device.

FIG. 3 is an enlarged partial view of a semiconductive device 300. This view illustrates a conventionally formed trench 310 located in the substrate 115. Since the size of every component structure in the semiconductive device 300 continues to shrink, the trench 310 in many embodiments will have a high aspect width to depth ratio ranging from about 1:3 to 1:5. In one example, the width of the trench at its upper edge will be about 90 nm or less, and in a more specific embodiment, the upper width will be about 65 nm or less. The trench 310 may have a generally tapered configuration similar to the one that is illustrated.

Figure 4:
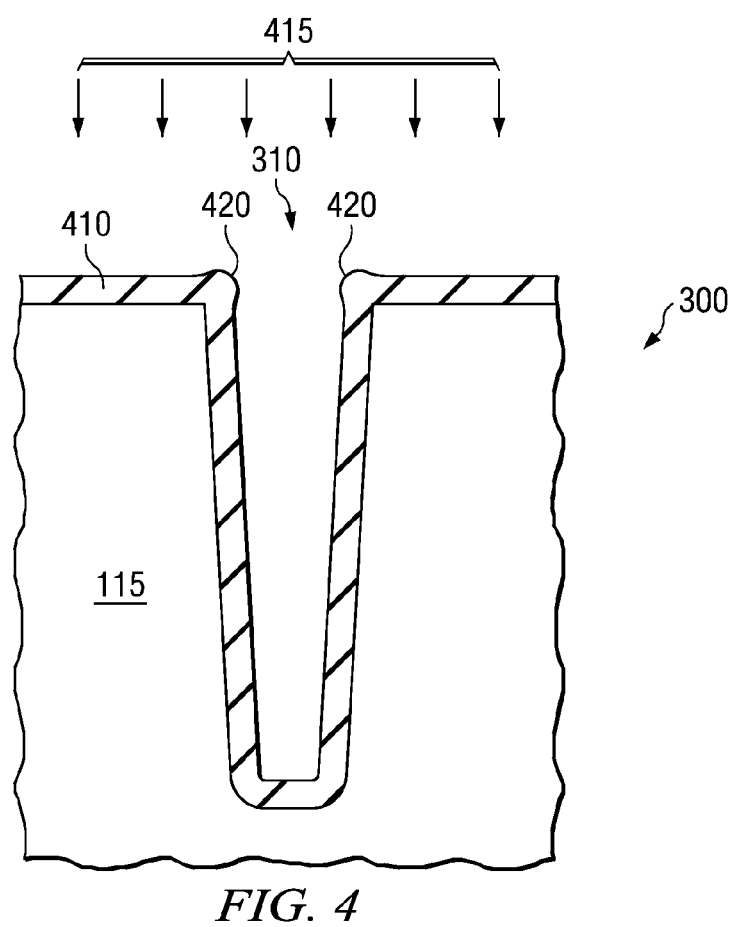
FIG. 4 illustrates a sectional view of the trench following the deposition of an oxide liner.

FIG. 4 shows the semiconductive device 300 during the formation of a film 410 in the trench 310 in the second chamber 215 of FIG. 2. The gas mixture 415, as discussed above, is passed over the semiconductive device 300 and forms the film 410. In one aspect, the film 410 is an oxide liner. Also as mentioned above, the deposition can now be conducted at the lower temperatures of less than about 800° C. or less than about 700° C. due to the fact that the chlorine is substantially disassociated from the hydrocarbon. Thus, thinner films than those provided by the discussed conventional processes can be achieved. Since no deposition process accomplishes perfect deposition thickness uniformity, the thickness of the film 410 will vary in the trench to a degree. However, the average film thickness in the trench 310 will be about 8 nm or 7.5 nm or less.

It should also be noted that the film 410 includes rounded corners 420 that are located at the upper edges of the trench 310 and that have thicknesses that are greater than the average thickness of the film 410 located in the trench. The free chlorine in the gas mixture allows the rounded corners 420 to form, which lends structural integrity to the semiconductive device 300. Additionally, because the chlorine is incorporated into the film 410, it acts as a getter for contaminants, such as sodium or iron.

Figure 5:
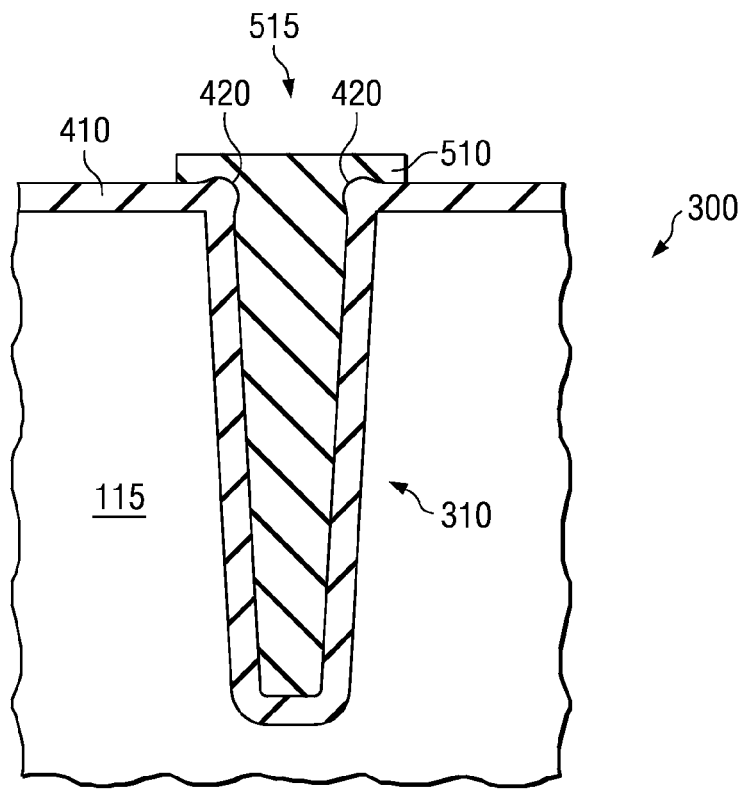
FIG. 5 illustrates a sectional view of the trench at least substantially filled with a dielectric material.

Following the formation of the film 410, the trench is conventionally filled with a dielectric material 510, such as a high density plasma oxide, as shown in FIG. 5, to complete the formation of an isolation trench 515. Because the thickness of the film 410 is well controlled to the thinner thicknesses, the dielectric is less likely to develop voids within the trench 310. As seen, the dielectric material 510 at least substantially fills the trench 310, and in some embodiments, overlaps the rounded corners 420 and a portion of the film 410 located on the surface of the substrate 115.

Figure 6:
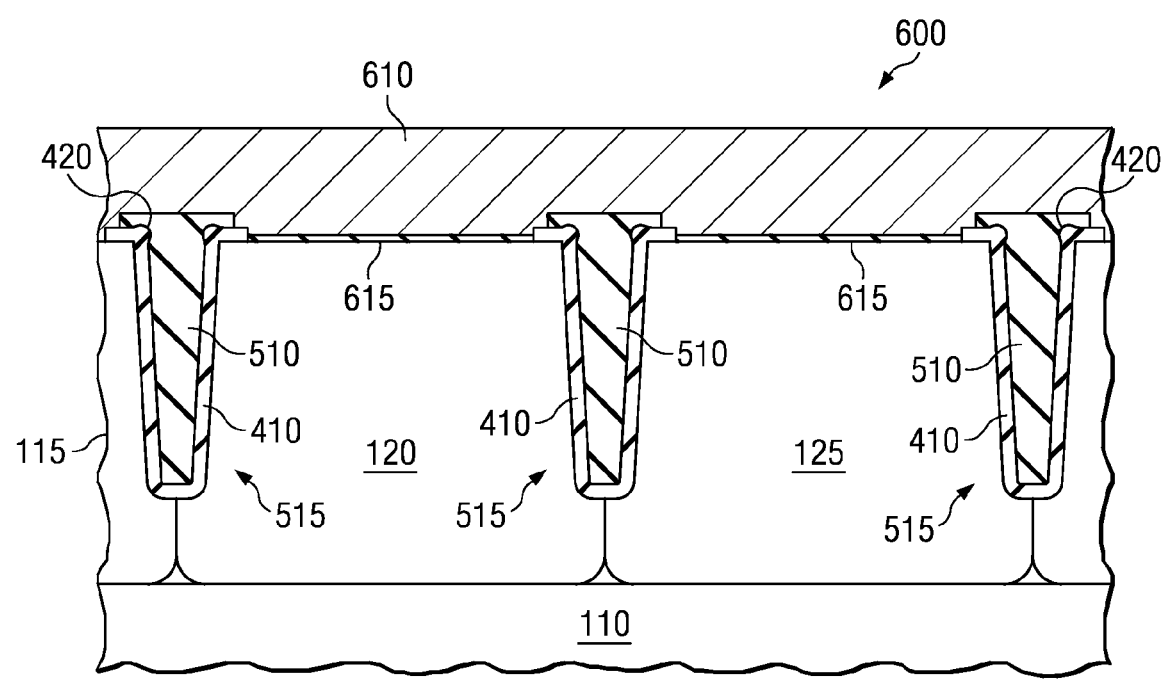
FIG. 6 illustrates a sectional view of a early stage of manufacture of the semiconductive device with a gate layer.

FIG. 6 illustrates a semiconductive device 600 after the formation of a gate layer 610 over the active region 115 and the isolation trenches 515 of FIG. 5. It should be noted that portions of the oxide film 410 located outside the dielectric material 510 have been conventionally removed, and a conventional, high quality gate oxide 615 has been formed over the active region 515 in which the wells 120 and 125 were conventionally formed at an earlier point in the manufacturing process. The gate layer 610 may be formed by conventional deposition processes and may be comprised of conventional materials, such doped polysilicon, metal, metal silicide, or combinations thereof. The gate layer 610 may also be a stacked combination of these materials. The gate layer 610 overlies the rounded corners 420 of the isolation trenches 515. Due to the larger thicknesses associated with the rounded corners 420, operating voltages will not cause structural damage that can occur when the round corners 420 are not present. At this point in the semiconductive device's 600 manufacture and continuing forward, those skilled in the art would understand how to complete fabrication of the semiconductive device 600 to form an operative IC.

Figure 7:
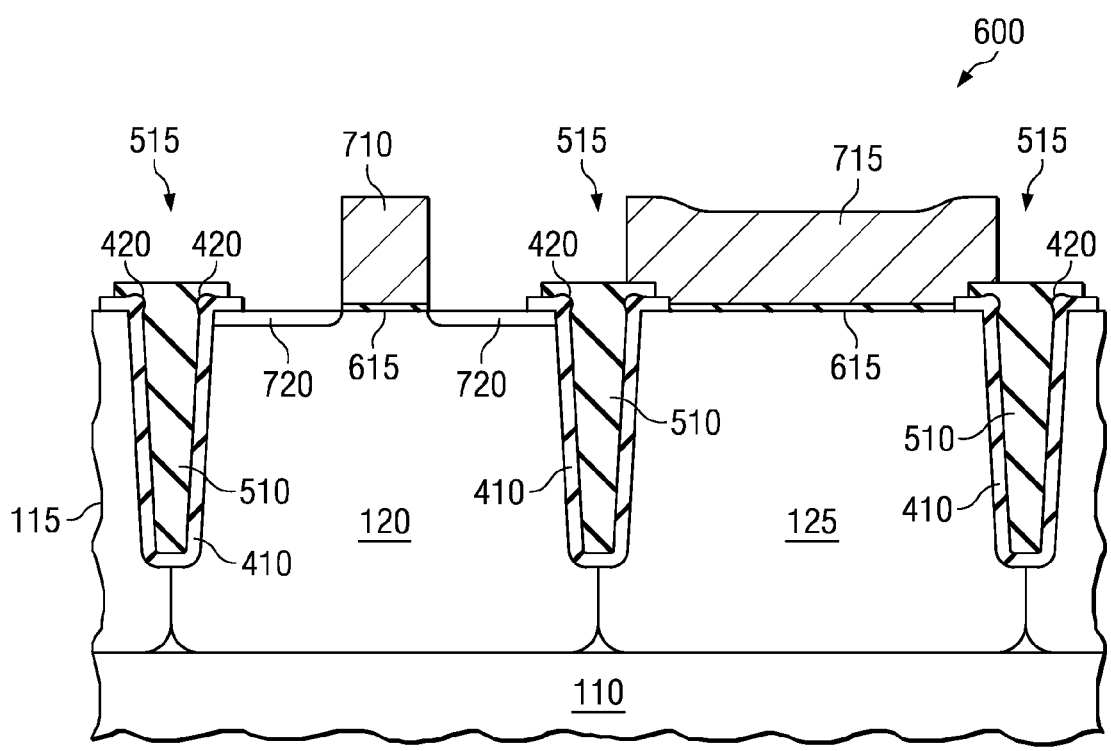
FIG. 7 illustrates a sectional view of the semiconductive device at an early stage of manufacture with patterned gates and lightly doped source/drain regions.

FIG. 7 is the semiconductive device 600 following a conventional patterning of the gate layer 610 that forms conventional gate structures 710 and 715. The gate structure 715 is patterned such that it overlaps the rounded corners 420. Also shown are lightly doped implants regions 720 adjacent the gate structure 710, which are conventionally formed following the patterning of the gate structures 710 and 715.

Figure 8:
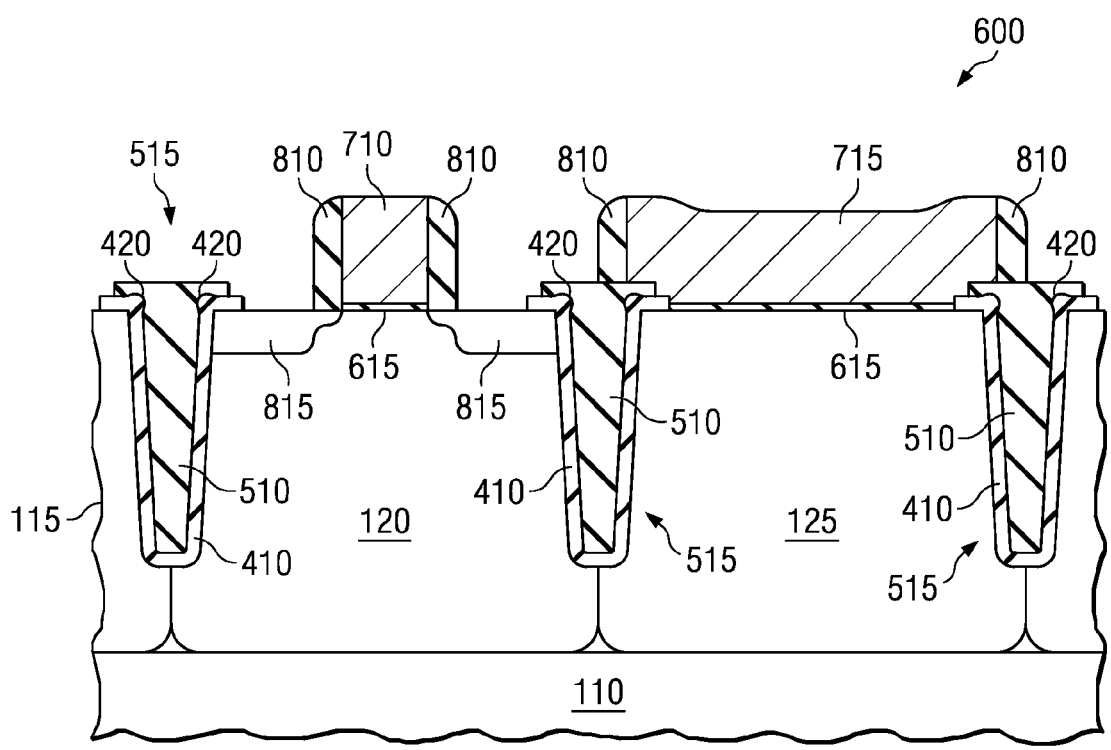
FIG. 8 illustrates a sectional view of the semiconductive device at an early stage of manufacture including source/drain regions and oxide spacers formed on the patterned gates.

FIG. 8 is the semiconductive device 600 following the conventional formation of oxide spacers 810 and source/drains 815, which basically completes the semiconductive device 600. Other variations of the semiconductive device 600 are also within the scope of the invention.

Figure 9:
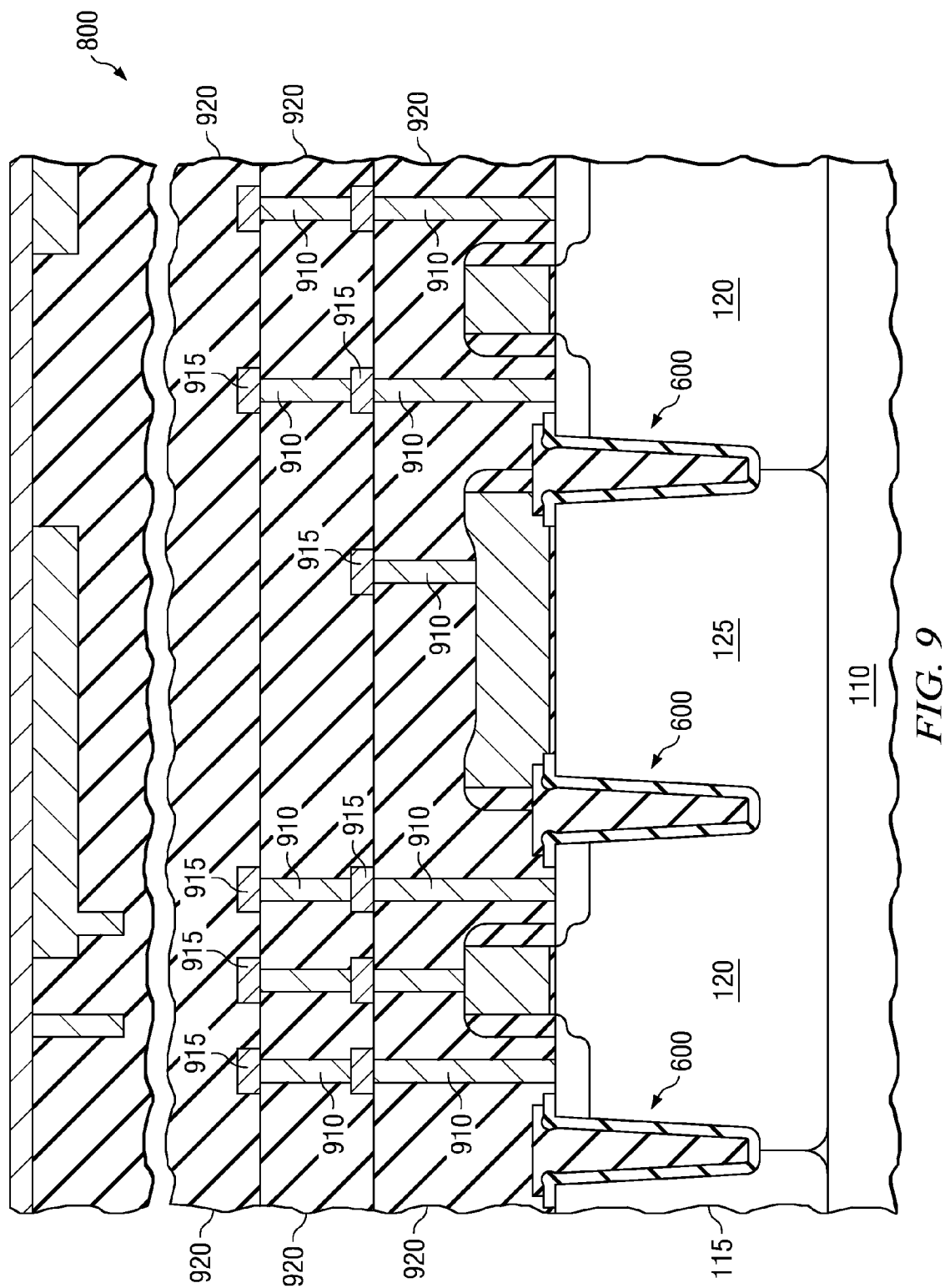
FIG. 9 illustrates a sectional view of an integrated circuit (IC) incorporating the semiconductive device.

FIG. 9 is an integrated circuit (IC) 900 that incorporates the completed semiconductive device 600 of FIG. 8. The semiconductive device 600 may be configured into a wide variety of devices, such as CMOS devices, BiCMOS devices, Bipolar devices, as well as capacitors or other types of devices. The IC 900 may further include passive devices, such as inductors or resistors, or it may also include optical devices or optoelectronic devices. Those skilled in the art are familiar with these various types of devices and their manufacture. The semiconductive device 600 includes the various components as discussed above, and conventional interconnect structures 910 and metal lines 915 electrically connect the components of the semiconductive device 600 to form an operative IC. The interconnect structures 910 and metal lines 915 may be formed in conventional dielectric layers 920 that are located over the semiconductive device 600. The number of dielectric layers 920 and metal lines 915 will varying with design.

Those skilled in the art to which the invention relates will appreciate that other and further additions, deletions, substitutions, and modifications may be made to the described example embodiments, without departing from the invention.

What is claimed is:

1. A method of fabricating a semiconductive device, comprising:

forming an isolation trench within a semiconductive substrate;

heating within a first chamber a gas mixture comprising chlorohydrocarbon having a general formula of $C_xH_xCl_x$ wherein x=2, 3, or 4, to a first temperature to substantially disassociate the chlorohydrocarbon;

placing the semiconductive substrate into a second chamber;

in the second chamber, forming an oxide liner in the isolation trench with the substantially disassociated chlorohydrocarbon, wherein the oxide liner forms with rounded corners at upper edges of the trench and the oxide liner formed at the corners forms with a thickness greater than an average thickness of the oxide liner located within the isolation trench; and patterning a transistor gate structure such that, subsequent to patterning, the transistor gate structure overlaps the rounded corners of the liner.

2. The method recited in claim 1, wherein a flow rate of the chlorohydrocarbon through the first chamber ranges from about 4 liters per minutes to about 11 liters per minute.

3. The method recited in claim 1, wherein forming the oxide liner comprises forming the oxide liner in the second chamber at a second temperature that is below the first temperature and wherein the first temperature is greater than about 800° C. and the second temperature is less than about 800° C.

4. The method recited in claim 3, wherein the first temperature is greater than about 900° C. and the second temperature is less than 700° C.

5. The method recited in claim 1, wherein the first chamber has an increased interior surface area and the chlorohydrocarbon is passed over the increased interior surface area at the first temperature.

6. The method recited in claim 1, wherein the first chamber has an increased interior surface area wherein the increased surface area ranges from about 10 times to about 140 times over an original surface area of the first chamber and wherein the chlorohydrocarbon is passed over the increased interior surface area at the first temperature.

7. The method recited in claim 1, wherein the chlorohydrocarbon is trans-dichloroethylene, cis-dichloro-ethylene, 1,1-dichloroethylene, or mixtures thereof.

8. The method recited in claim 1, wherein forming the oxide liner comprises forming the oxide liner to a thickness less than about 8 nm.

9. The method recited in claim 1, wherein about 90% to about 100% of the chlorohydrocarbon is disassociated in the first chamber.

10. The method recited in claim 1, wherein the oxide liner located within the isolation trench has an average thickness less than about 8 nm.

11. The method recited in claim 10, wherein the isolation trench has a width at an upper edge less than about 90 nm.

12. The method recited in claim 10 wherein the semiconductive device is an integrated circuit and the method further comprises:

forming transistors over or within the semiconductive substrate;

depositing dielectric layers over the transistors;

forming interconnects within dielectric layers that electrically interconnect the transistors to form an operative integrated circuit.

13. The method recited in claim 10 further comprising filling the isolation trench with a dielectric material.

14. The method recited in claim 1 further comprising flowing oxygen into the first chamber with the chlorohydrocarbon.

* * * * *